(12) United States Patent
Tani

(10) Patent No.: US 10,935,876 B2
(45) Date of Patent: Mar. 2, 2021

(54) LIGHT SOURCE DEVICE, PROJECTION DISPLAY DEVICE, AND METHOD OF COOLING SEMICONDUCTOR LIGHT-EMITTING ELEMENT

(71) Applicant: NEC Display Solutions, Ltd., Tokyo (JP)

(72) Inventor: Yusuke Tani, Tokyo (JP)

(73) Assignee: NEC DISPLAY SOLUTIONS, LTD., Tokyo (JP)

( * ) Notice: Subject to any disclaimer, the term of this patent is extended or adjusted under 35 U.S.C. 154(b) by 172 days.

(21) Appl. No.: 16/310,769

(22) PCT Filed: Jul. 28, 2016

(86) PCT No.: PCT/JP2016/072201
§ 371 (c)(1),
(2) Date: Dec. 17, 2018

(87) PCT Pub. No.: WO2018/020644
PCT Pub. Date: Feb. 1, 2018

(65) Prior Publication Data
US 2020/0319538 A1 Oct. 8, 2020

(51) Int. Cl.
*G03B 21/16* (2006.01)
*G03B 21/20* (2006.01)
(Continued)

(52) U.S. Cl.
CPC ......... *G03B 21/16* (2013.01); *G03B 21/2013* (2013.01); *G03B 21/2033* (2013.01);
(Continued)

(58) Field of Classification Search
CPC ...... G03B 21/16; G03B 21/28; G03B 21/145; G03B 21/2013; G03B 21/2033;
(Continued)

(56) References Cited

U.S. PATENT DOCUMENTS

2005/0168990 A1* 8/2005 Nagata .................... F21V 29/70
362/294
2008/0191236 A1* 8/2008 De Graaf ............ F28D 15/0233
257/99

(Continued)

FOREIGN PATENT DOCUMENTS

CN 104112982 A 10/2014
CN 203859970 U 10/2014
(Continued)

OTHER PUBLICATIONS

Chinese Office Action, dated Apr. 3, 2020, in Chinese Application No. 201680088038.6 and English Translation thereof.

(Continued)

*Primary Examiner* — Sultan Chowdhury
(74) *Attorney, Agent, or Firm* — McGinn IP Law Group, PLLC

(57) ABSTRACT

A plurality of semiconductor light-emitting elements are to be efficiently cooled. There are provided a plurality of semiconductor light-emitting elements that are arranged in n rows and m columns, and a plurality of flow channels where a cooling medium flows through, the plurality of flow channels being formed to sandwich the n rows of semiconductor light-emitting elements or the m columns of semiconductor light-emitting elements.

8 Claims, 7 Drawing Sheets

(51) Int. Cl.
  *H01L 25/075* (2006.01)
  *H01L 33/62* (2010.01)
  *H01L 33/64* (2010.01)
  *H01S 5/024* (2006.01)

(52) U.S. Cl.
  CPC .......... *H01L 25/0753* (2013.01); *H01L 33/62* (2013.01); *H01L 33/648* (2013.01); *H01S 5/02423* (2013.01); *H01L 2933/0075* (2013.01)

(58) Field of Classification Search
  CPC ..... H01L 25/16; H01L 25/18; H01L 25/0753; H01L 25/0756; H01L 33/20; H01L 33/48; H01L 33/62; H01L 33/645; H01L 33/648; H01S 5/40; H01S 5/42; H01S 5/4025; H01S 5/02423
  See application file for complete search history.

(56) References Cited

U.S. PATENT DOCUMENTS

2009/0303446 A1* 12/2009 Matsumoto .......... G02B 27/145
  353/37
2013/0100974 A1* 4/2013 Janssens ............ G03B 21/2013
  372/35

FOREIGN PATENT DOCUMENTS

| | | |
|---|---|---|
| JP | 2001-326411 A | 11/2001 |
| JP | 2005-317925 A | 11/2005 |
| JP | 2006-019557 A | 1/2006 |
| JP | 2006-278041 A | 10/2006 |
| JP | 2007-200869 A | 8/2007 |
| JP | 2011-165760 A | 8/2011 |
| JP | 2012-256860 A | 12/2012 |
| JP | 2013-030574 A | 2/2013 |
| JP | 2013-229519 A | 11/2013 |
| JP | 2015-038554 A | 2/2015 |
| JP | 2015-177101 A | 10/2015 |
| JP | 2015-185611 A | 10/2015 |
| WO | WO 2016/012724 A1 | 1/2016 |

OTHER PUBLICATIONS

Japanese Office Action, dated Dec. 17, 2019, in Japanese Application No. 2018-530287 and English Translation thereof.
International Search Report (ISR) (PCT Form PCT/ISA/210), in PCT/JP2016/072201, dated Oct. 11, 2016.

* cited by examiner

LIGHT SOURCE DEVICE, PROJECTION DISPLAY DEVICE, AND METHOD OF COOLING SEMICONDUCTOR LIGHT-EMITTING ELEMENT

TECHNICAL FIELD

The present invention relates to a light source device, a projection display device, and a method of cooling a semiconductor light-emitting element.

BACKGROUND ART

A semiconductor light-emitting element, such as a light-emitting diode or a semiconductor laser, which is used as a light source of a projection display device or the like, emits light when electricity flows therethrough, and also generates heat at the time of emitting light. When the temperature of the semiconductor light-emitting element rises, light-emitting efficiency is reduced, and a sufficient amount of light cannot be obtained, and also, the life of the semiconductor light-emitting element is reduced. For a projection display device to stably exhibit optical performance and to continuously maintain performance, control has to be performed in such a way that the semiconductor light-emitting element is cooled such that the temperature at the time of use falls to or below a certain temperature.

Patent Literature 1 (JP2001-326411A) discloses, as a method of cooling a semiconductor light-emitting element, a technique of receiving heat from a back surface of a semiconductor laser array where a plurality of semiconductor lasers are built in, and of effectively discharging the heat by a fin provided at a heat dissipation unit.

CITATION LIST

Patent Literature

Patent Literature 1: JP2001-326411A

SUMMARY OF INVENTION

Technical Problem

With the technique disclosed in Patent Literature 1, the semiconductor laser array where a plurality of semiconductor lasers are built in is cooled, but the technique is not for cooling a plurality of semiconductor light-emitting elements forming the semiconductor laser array. In the case where semiconductor light-emitting elements forming a light source are to be cooled, especially if brightness of the light source is high, it is difficult to arrange a heat dissipating fin, which is effective for cooling, between the semiconductor light-emitting elements. In the case of using one heat dissipating fin for a plurality of semiconductor light-emitting elements, a length of the cooling fin is increased, and there is a problem that ventilation resistance is increased and that air does not flow in.

Power supply terminals for supplying power to a plurality of semiconductor light-emitting elements are provided on back surfaces of the semiconductor light-emitting elements, and terminals of the plurality of semiconductor light-emitting elements have to be electrically connected thereto by using a substrate. A heat dissipating fin is installed while going around the substrate, and thus, an effective fin as described in Patent Literature 1 is difficult to arrange.

Nowadays, a projection display device is desired to have high brightness. In response, high-output semiconductor light-emitting elements are being used as semiconductor light-emitting element for forming a light source, and the amount of heat generation is increasing. As a result, the temperature of the semiconductor light-emitting element is on the increase, and higher cooling performance is being desired.

The present invention has its object to provide a light source device, a projection display device, and a method of cooling a semiconductor light-emitting element, which are for efficiently cooling a plurality of semiconductor light-emitting elements.

Solution to Problem

A light source device of the present invention includes a plurality of semiconductor light-emitting elements that are arranged in n rows and m columns; and a plurality of flow channels where a cooling medium flows through, the plurality of flow channels being formed to sandwich the n rows of semiconductor light-emitting elements or the m columns of semiconductor light-emitting elements.

A projection display device of the present invention includes a cooling structure for the semiconductor light-emitting element described above.

A method, of the present invention, of cooling a semiconductor light-emitting elements that are arranged in n rows and m columns, the method including forming a plurality of flow channels, where a cooling medium flows through, in such a way as to sandwich the n rows of semiconductor light-emitting elements or the m columns of semiconductor light-emitting elements.

Advantageous Effect of Invention

According to the present invention having the configurations described above, a plurality of semiconductor light-emitting elements may be efficiently cooled.

DESCRIPTION OF EMBODIMENTS

Next, exemplary embodiments will be described with reference to the drawings.

First Exemplary Embodiment

Figure 1:
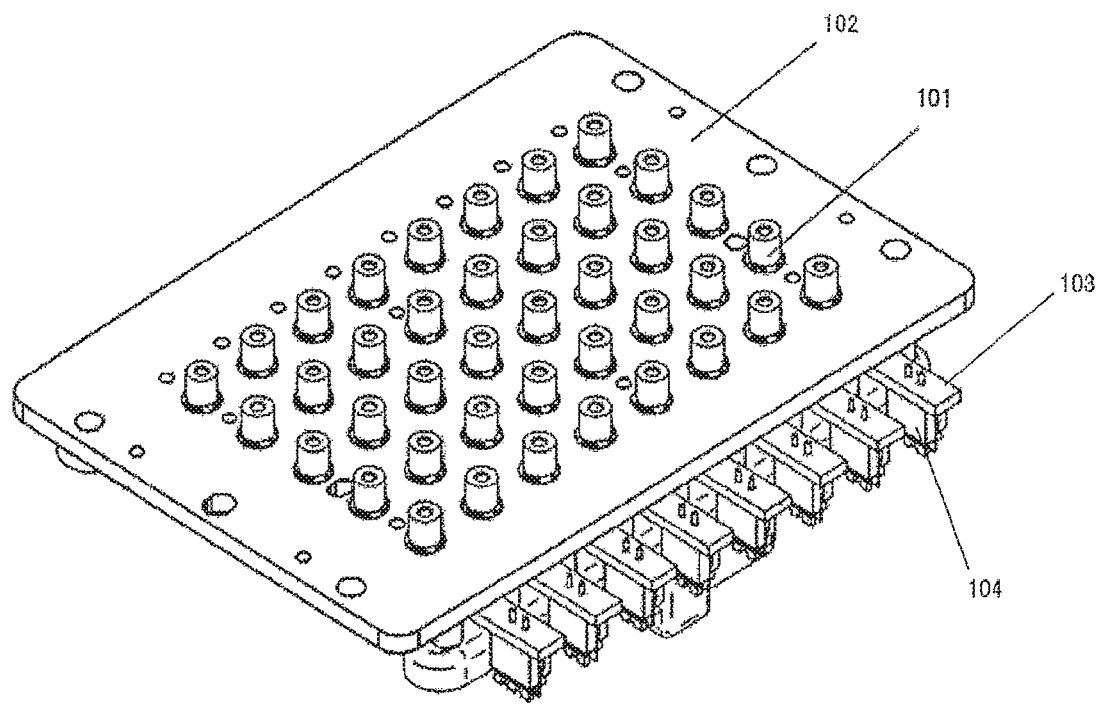
FIG. 1 is a perspective view showing a configuration of an exemplary embodiment of a light source device according to the present invention.
Figure 2:
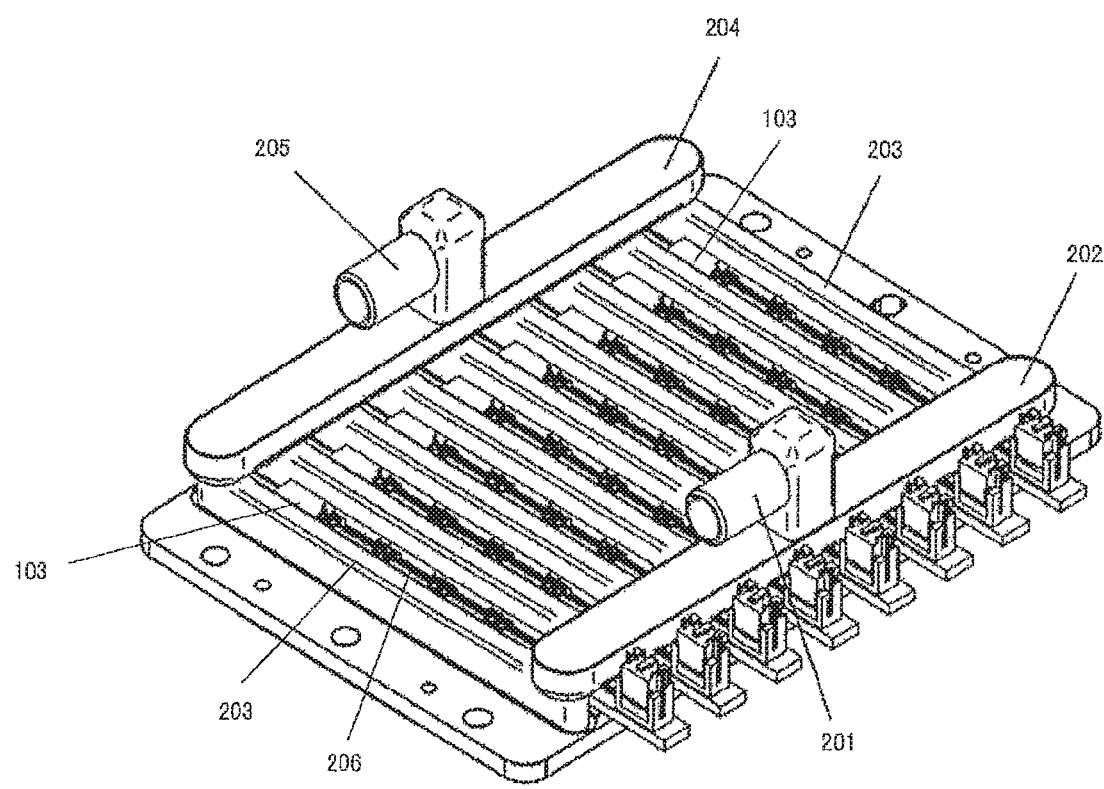
FIG. 2 is a perspective view showing FIG. 1 from a lower surface side.

FIG. 1 is a perspective view showing a configuration of an exemplary embodiment of a light source device according to the present invention, and FIG. 2 is a perspective view showing FIG. 1 from a lower surface side.

Figure 3:
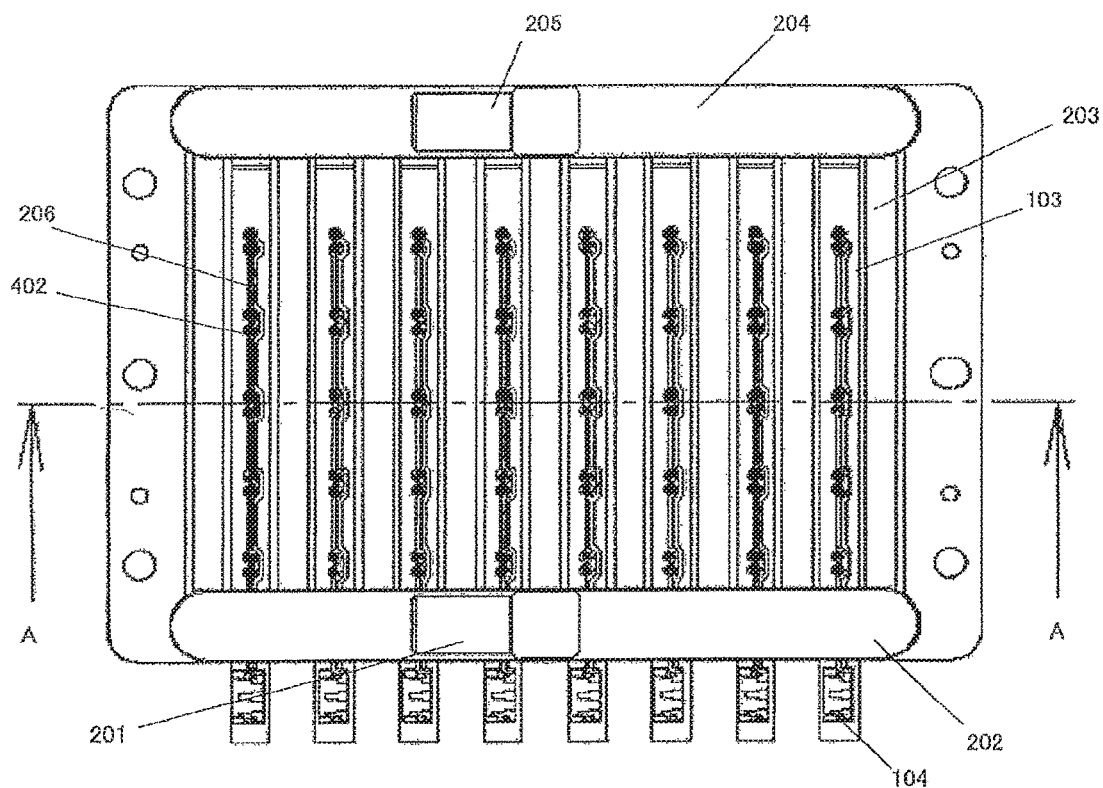
FIG. 3 is a plan view showing substrate 103 from a side of a surface opposite a surface where semiconductor light-emitting device 101 is mounted.

In the present exemplary embodiment, semiconductor light-emitting element 101, which is a light-emitting diode or a semiconductor laser, is attached to substrate 103. FIG. 3 is a plan view showing substrate 103 from a side of a surface opposite a surface where semiconductor light-emitting device 101 is mounted, and FIG. 4 is a cross-sectional view partially enlarging an A-A cross-section in FIG. 3.

Figure 4:
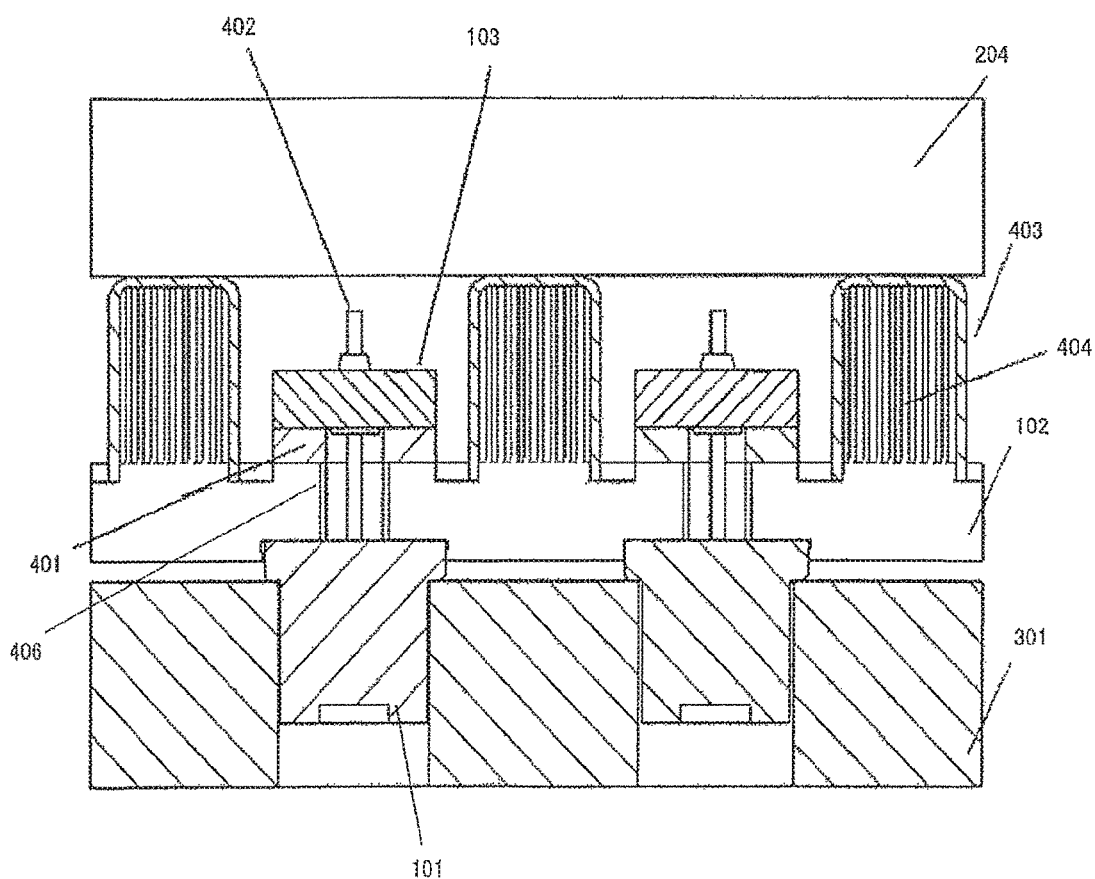
FIG. 4 is a cross-sectional view partially enlarging an A-A cross-section in FIG. 3.

As shown in FIG. 4, a total of 40 semiconductor light-emitting elements 101, i.e., 5 rows×8 columns, are held by holding member 102, and lead terminal 402 of semiconductor light-emitting element 101 is electrically connected to substrate 103 through through hole 406 provided in holding member 102 and insulating member 401 provided around through hole 406.

As shown in FIGS. 2 and 3, eight substrates 103 are provided, and five (one column) semiconductor light-emitting elements 101 are mounted on each substrate 103. Substrate 103 has an elongated shape, and connector 104 for supplying power to each semiconductor light-emitting element 101 is provided at an end portion of substrate 103. Connector 104 and each semiconductor light-emitting element 101 are joined by wire 206 formed on substrate 103. Semiconductor light-emitting element 101 includes two lead terminals 402, and as shown in FIG. 3, a line joining the pair of lead elements 402 is arranged on each semiconductor light-emitting element 101, along a direction coinciding with a longitudinal direction (an array direction of semiconductor light-emitting elements 101) of substrate 103.

As shown in FIG. 2, substrates 103 are installed with the longitudinal directions being parallel to each other, and a plurality of flow channels 203 are provided on both sides of each substrate 103 in a manner sandwiching substrate 103. In this manner, a plurality of flow channels 203 are provided correspondingly with one column of semiconductor light-emitting elements 101 mounted on each substrate 103. Flow channel 203 is where a cooling liquid flows through, and flow channel 203 communicates between branching chamber 202 and merging chamber 204 provided on both ends of substrate 203. Inlet port 201 is provided at branching chamber 202, and outlet port 205 is provided at merging chamber 204.

The cooling liquid is caused by a pump (not shown) or the like to flow in from inlet port 201, and is divided at branching chamber 202 to flow into each flow channel 203. As shown in FIG. 4, flow channel 203 is configured from fin-shaped heat dissipating member 404, which is formed on a surface, of holding member 102, opposite a surface where semiconductor light-emitting element 101 is mounted, and flow channel cover 403 covering heat dissipating member 404, and the cooling liquid is merged at merging chamber 204 after cooling heat dissipating member 404, discharged to a radiator (not shown) from outlet port 205, cooled by heat dissipation by the radiator, and is returned to inlet port 201 by the pump.

Heat that is generated at semiconductor light-emitting element 101 and transferred to holding member 102 is removed by flow channel 203 which is adjacent to substrate 103. In the following, a cooling operation will be described in greater detail with reference to FIG. 4.

As shown in FIG. 4, semiconductor light-emitting device 101 is pressed against holding member 102 by pressing member 301. Additionally, pressing member 301 is omitted in FIG. 1 so as to clearly show semiconductor light-emitting element 101.

Lead terminal 402 of semiconductor light-emitting element 101 is connected to substrate 103, which is held by holding member 102 through insulating member 401. Heat that is generated at semiconductor light-emitting element 101 is transferred to holding member 102 to which semiconductor light-emitting element 101 is pressed against and heat dissipating member 404 formed on holding member 102, and is also transferred to lead terminal 402, and to substrate 103 through lead terminal 402.

As shown in the drawing, holding member 102 includes a recessed portion (a counterbored hole), and semiconductor light-emitting element 101 is installed in the recessed portion. At the time of installation of semiconductor light-emitting element 101, the recessed portion comes into contact with a side surface of semiconductor light-emitting element 101. That is, a rear surface and the side surface of semiconductor light-emitting element 101 come into contact with holding member 102. As a result, a sufficient heat dissipation area may be secured, and semiconductor light-emitting element 101 may be efficiently cooled.

Flow channel 203 shown in FIG. 2 is formed at a part which is adjacent to substrate 103. The cooling liquid which is divided at branching chamber 202 flows into flow channel 203, which is formed by flow channel cover 403, and absorbs heat from heat dissipating member 404.

The smaller the distance between semiconductor light-emitting element 101 and heat dissipating member 404, the higher the cooling efficiency for semiconductor light-emitting element 101, and thus, the heat dissipating member is desirably provided next to substrate 103.

Second Exemplary Embodiment

Next, a second exemplary embodiment will be described.

Figure 5:
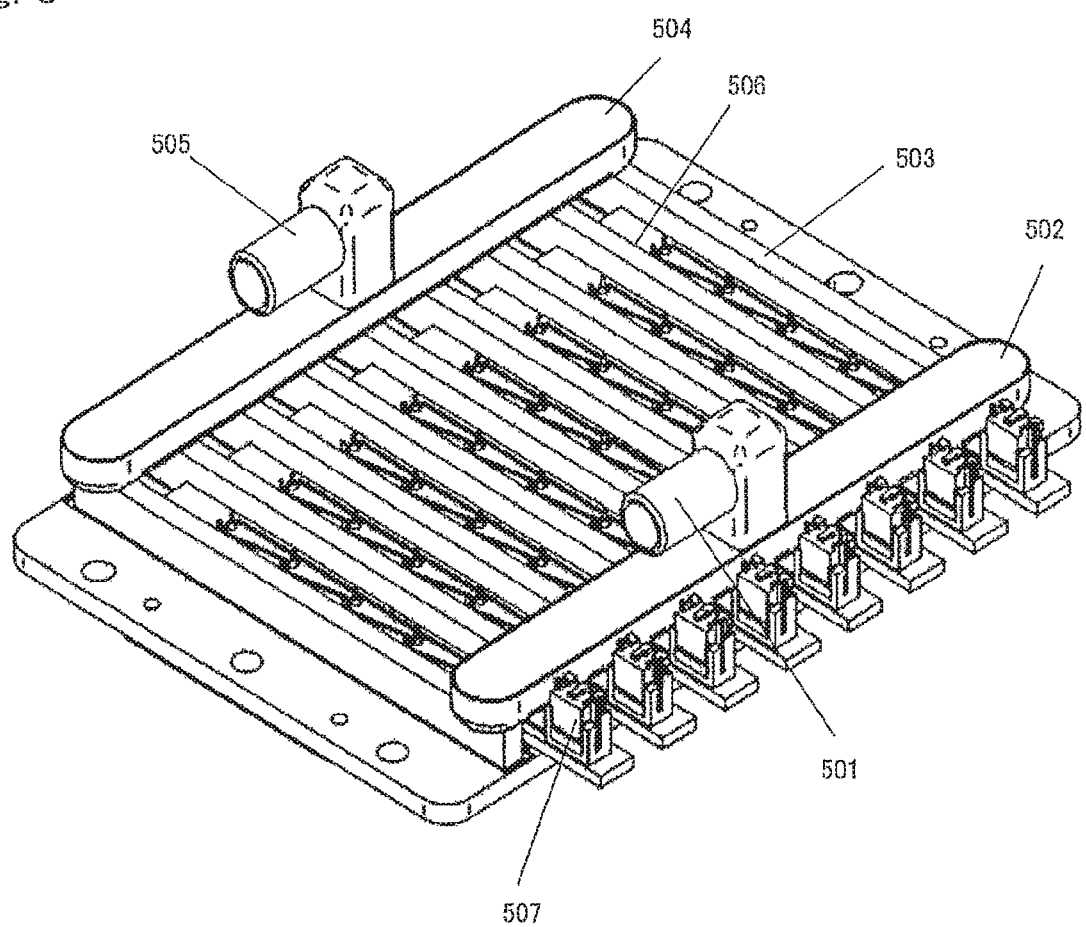
FIG. 5 is a perspective view showing a configuration of a second exemplary embodiment of the light source device according to the present invention.
Figure 6:
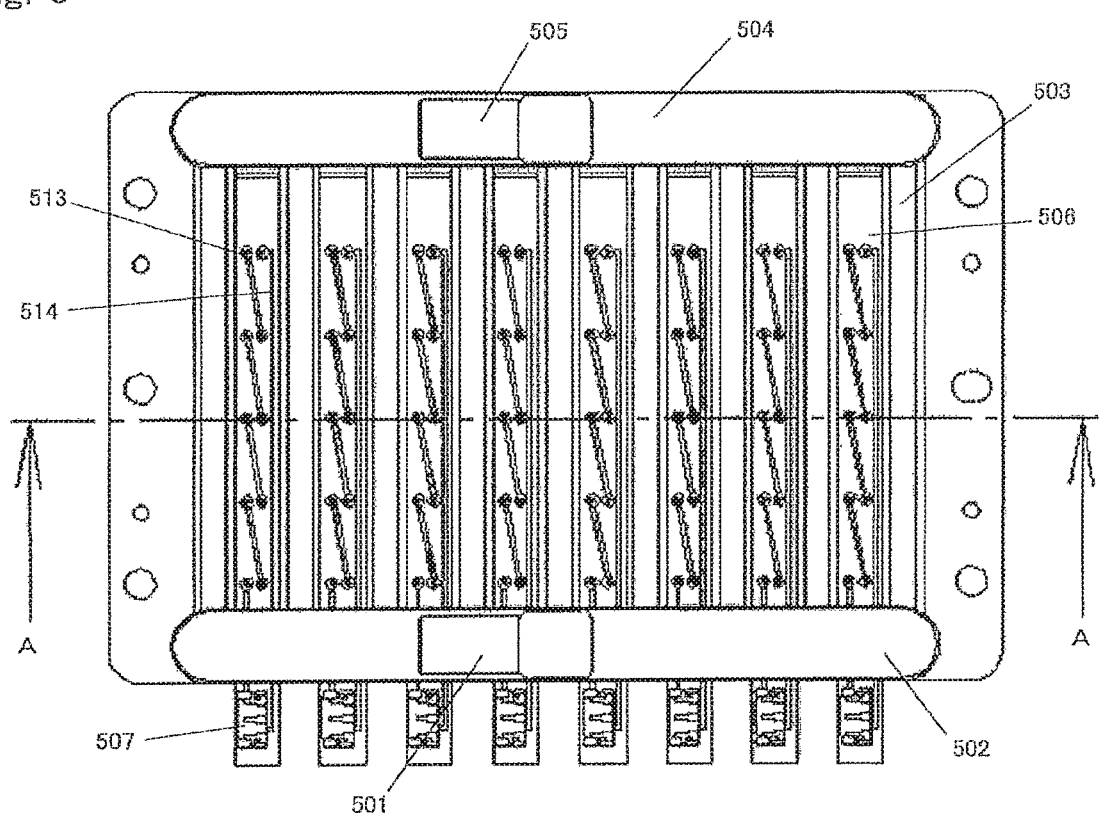
FIG. 6 is a plan view of the second exemplary embodiment of the light source device according to the present invention.
Figure 7:
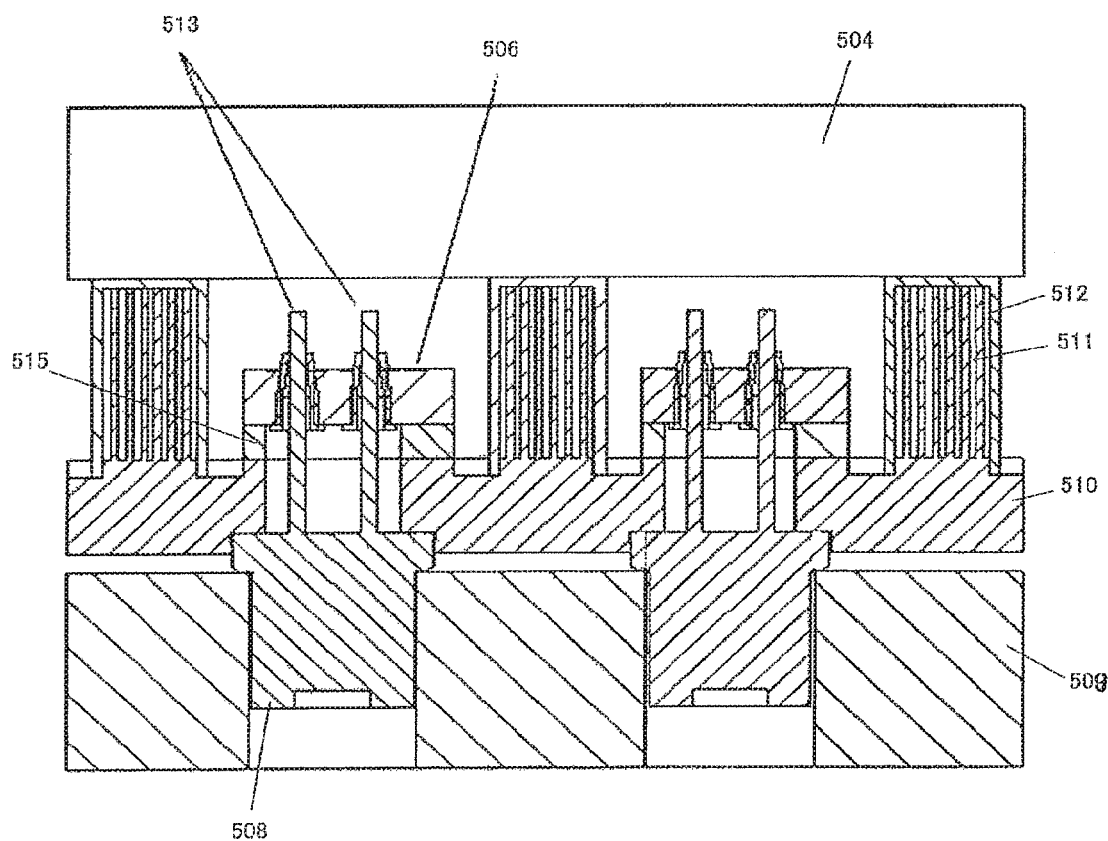
FIG. 7 is a cross-sectional view partially enlarging an A-A cross section in FIG. 6.

FIG. 5 is a perspective view showing a configuration of a second exemplary embodiment of the light source device according to the present invention, FIG. 6 is a plan view, and FIG. 7 is a cross-sectional view partially enlarging an A-A cross section in FIG. 6.

Also in the present exemplary embodiment, as in the first exemplary embodiment, five semiconductor light-emitting elements 508 are mounted on each of eight elongated substrates 506, and a plurality of flow channels 503 are provided in a manner sandwiching each substrate 506. Configurations of inlet port 501, branching chamber 502, merging chamber 504, and outlet port 505 for causing a cooling liquid to flow through each flow channel are also the same as those in the first exemplary embodiment.

As shown in FIG. 6, in the present exemplary embodiment, a line joining two lead terminals 513 is arranged on semiconductor light-emitting element 508, in a direction orthogonal to a longitudinal direction of substrate 506. Accordingly, holes, connector 507, and wire 514 for connection for connecting two lead terminals 513 have to be provided in a width direction of substrate 506 on the A-A cross section in FIG. 6, and a width is made greater than that of substrate 103 described in the first exemplary embodiment.

A cooling operation in the present exemplary embodiment will be described with reference to FIG. 7.

As shown in FIG. 7, semiconductor light-emitting element 508 is pressed against holding member 510 by pressing member 509. Lead terminals 513 of semiconductor light-emitting element 508 are connected to substrate 506, which is held by holding member 510 through insulating member 515. Heat that is generated at semiconductor light-emitting element 508 is transferred to holding member 510 to which semiconductor light-emitting device 508 is pressed against, and heat dissipating member 511 formed on holding member 510, and is also transferred to lead terminals 513, and to substrate 506 through lead terminals 513.

As shown in the drawing, holding member 510 includes a recessed portion (a counterbored hole), and semiconductor light-emitting element 508 is installed in the recessed portion. At the time of installation of semiconductor light-emitting element 508, the recessed portion comes into contact with a side surface of semiconductor light-emitting element 508. That is, a rear surface and the side surface of semiconductor light-emitting element 508 come into contact with holding member 510. As a result, a sufficient heat dissipation area may be secured, and semiconductor light-emitting element 508 may be efficiently cooled.

Flow channel 503 shown in FIG. 5 is formed at a part which is adjacent to substrate 506. A cooling liquid which is divided at branching chamber 502 flows into flow channel 503, which is formed by flow channel cover 512 covering heat dissipating member 511, and absorbs heat from heat dissipating member 511.

As described above, in the present exemplary embodiment, the width of substrate 506 is greater than in the first exemplary embodiment. Accordingly, a width of heat dissipating member 511 formed on holding member 510 is smaller than that of heat dissipating member 404 in the first exemplary embodiment, but with semiconductor light-emitting element 508, cooling may be efficiently performed even when the line joining two lead terminals 513 are arranged in a direction orthogonal to a longitudinal direction of substrate 506.

Third Exemplary Embodiment

Next, a third exemplary embodiment will be described.

Figure 8:
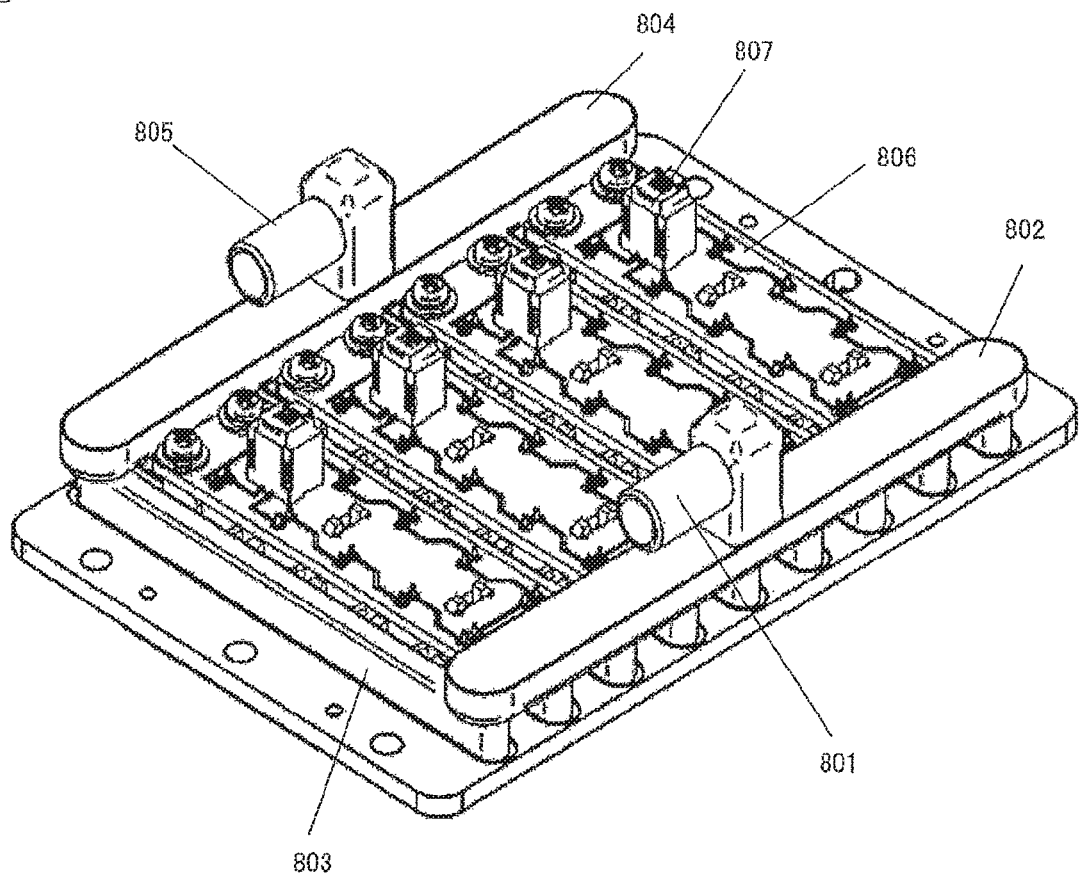
FIG. 8 is a perspective view showing a configuration of a third exemplary embodiment of the light source device according to the present invention.
Figure 9:
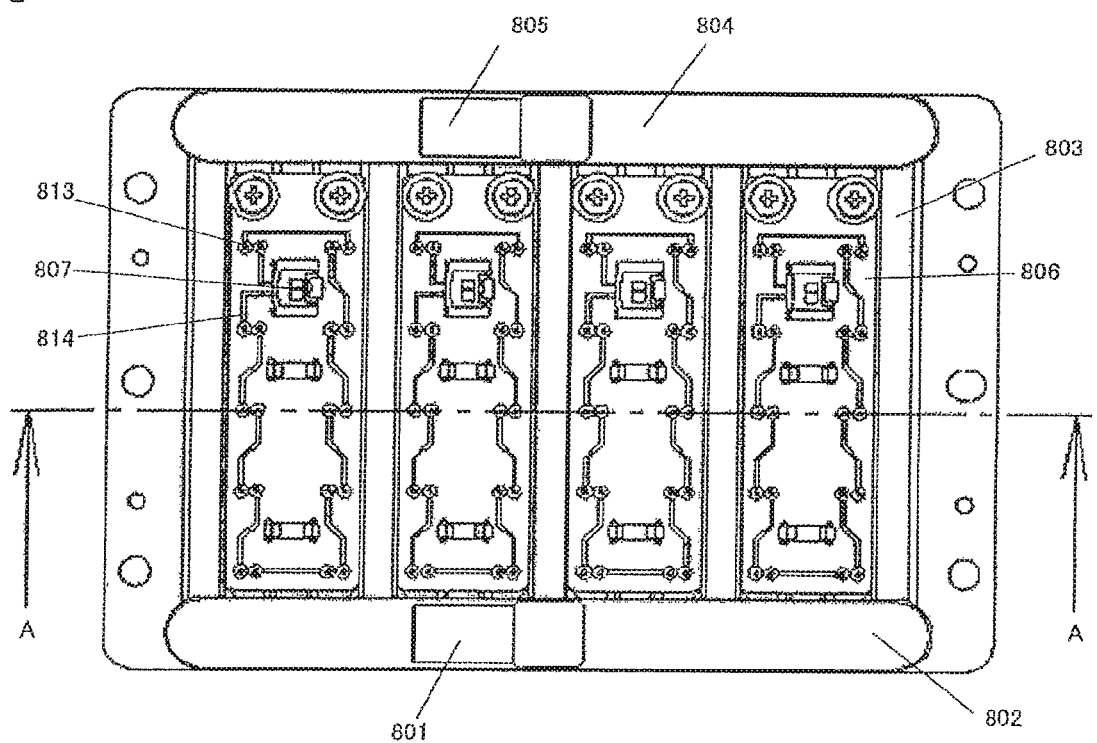
FIG. 9 is a plan view of the third exemplary embodiment of the light source device according to the present invention.
Figure 10:
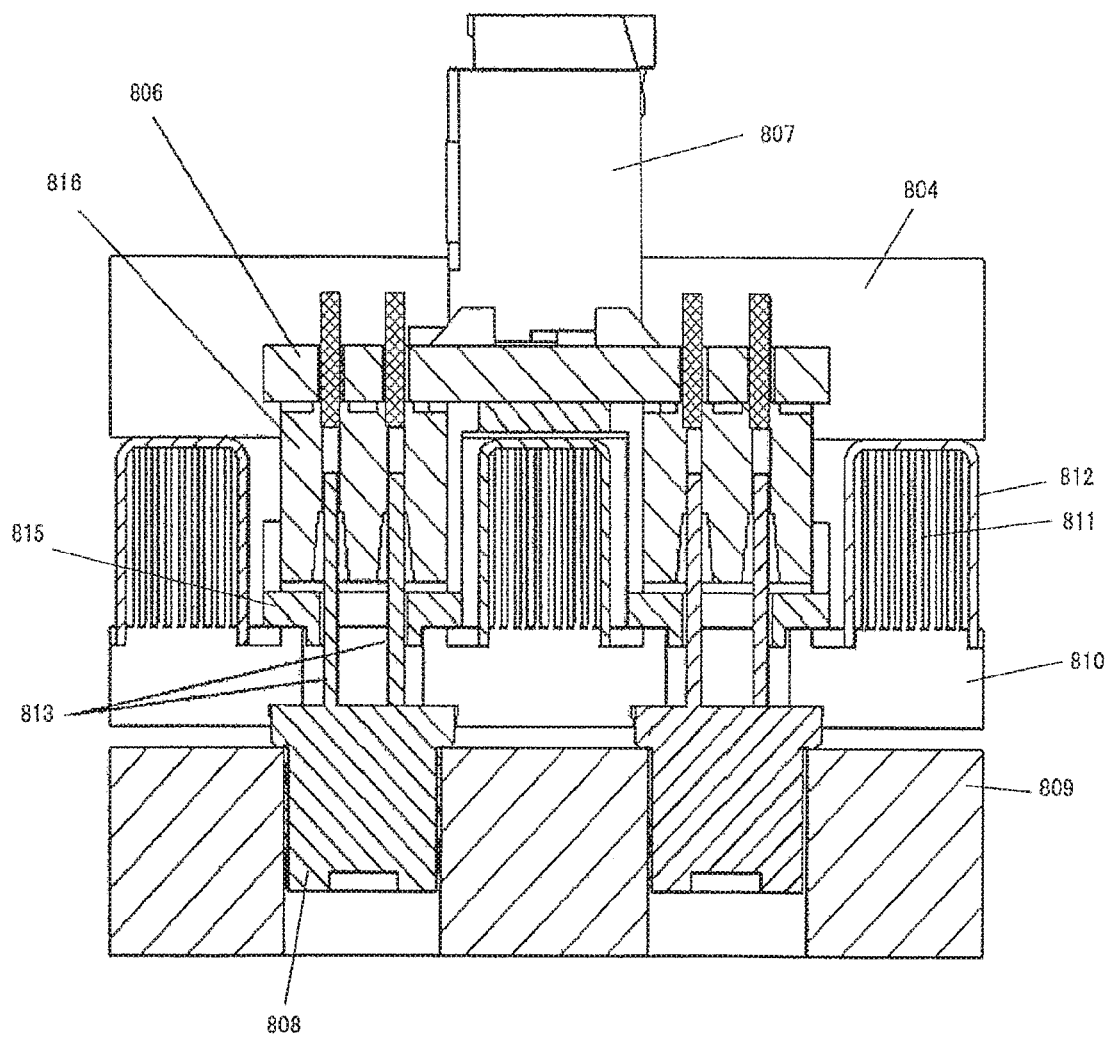
FIG. 10 is a cross-sectional view partially enlarging an A-A cross section in FIG. 9.

FIG. 8 is a perspective view showing a configuration of a third exemplary embodiment of the light source device according to the present invention, FIG. 9 is a plan view, and FIG. 10 is a cross-sectional view partially enlarging an A-A cross section in FIG. 9.

In the present exemplary embodiment, unlike in the first exemplary embodiment and the second exemplary embodiment, ten semiconductor light-emitting elements 808 are mounted on each of four elongated substrates 806. One column includes five semiconductor light-emitting elements 808, and two columns are mounted on one substrate 806, and on the whole, a total of 40 semiconductor light-emitting elements 808, i.e., 5 rows×8 columns, are mounted on holding member 810 in a positional relationship the same as those in the first exemplary embodiment and the second exemplary embodiment. Also in the present exemplary embodiment, a plurality of flow channels 803 are provided correspondingly with one column of semiconductor light-emitting elements 808 mounted on substrate 806. Configurations of inlet port 801, branching chamber 802, merging chamber 804, and outlet port 805, which are for causing a cooling liquid to flow through each flow channel 803, are also the same as those in the first exemplary embodiment and the second exemplary embodiment.

In the present exemplary embodiment, as shown in FIGS. 9 and 10, substrate 806 is electrically connected to conducting socket 816, and conducting socket 816 and lead terminal 813 are electrically connected, and power that is supplied to connector 807 is supplied to each semiconductor light-emitting element 808 through wire 814 and conducting socket 816.

A cooling operation in the present exemplary embodiment will be described with reference to FIG. 10.

As shown in FIG. 10, semiconductor light-emitting element 808 is pressed against holding member 810 by pressing member 809. Lead terminal 813 of semiconductor light-emitting element 808 and substrate 806 are connected to conducting socket 816, which is held by holding member 810 through insulating member 815. Heat that is generated at semiconductor light-emitting element 808 is transferred to holding member 810 that is pressed against and heat dissipating member 811 formed on holding member 810, and is also transferred to lead terminal 813, conducting socket 816, and substrate 806.

As shown in the drawing, holding member 810 includes a recessed portion (a counterbored hole), and semiconductor light-emitting element 808 is installed in the recessed portion. At the time of installation of semiconductor light-emitting element 808, the recessed portion comes into contact with a side surface of semiconductor light-emitting element 808. That is, a rear surface and the side surface of semiconductor light-emitting element 808 come into contact with holding member 810. As a result, a sufficient heat dissipation area may be secured, and semiconductor light-emitting element 101 may be efficiently cooled.

Flow channel 803 shown in FIG. 8 is formed at a part which is adjacent to conducting socket 816. The cooling liquid which is divided at branching chamber 802 flows into flow channel 803, which is formed by flow channel cover 812 covering heat dissipating member 811, and absorbs heat from heat dissipating member 811.

In the present exemplary embodiment having the configuration described above, flow channel 803 is not arranged adjacent to substrate 806, and thus, substrate 806 does not have to be prepared for each column of semiconductor light-emitting elements 808. In the first exemplary embodiment and the second exemplary embodiment, where a substrate is used for each column of semiconductor light-emitting elements, eight substrates are needed, but in the present exemplary embodiment, two columns of substrates are used for one substrate, and thus, four substrates 806 are used, and the present exemplary embodiment is advantageous from the standpoint of design and manufacturing. Additionally, in the present exemplary embodiment, two columns of semiconductor light-emitting elements are used for one substrate, but a greater number of columns of semiconductor light-emitting elements may be used for one substrate, or semiconductor light-emitting elements of all the columns may be mounted on one substrate.

In the first to third exemplary embodiments described above, a description is given assuming that a cooling liquid is to flow through the flow channel, but a cooling medium that flows through the flow channel may be a cooling gas instead of a cooling liquid, and is not limited to a cooling liquid.

Furthermore, a description is given assuming that the flow channels are provided correspondingly with columns of the semiconductor light-emitting elements which are arranged in n rows and m columns, but the flow channels may, of course, be provided correspondingly with the rows. In this case, in the first and second exemplary embodiments, five substrates are used, where eight semiconductor light-emitting elements are mounted on each substrate.

Fourth Exemplary Embodiment

Figure 11:
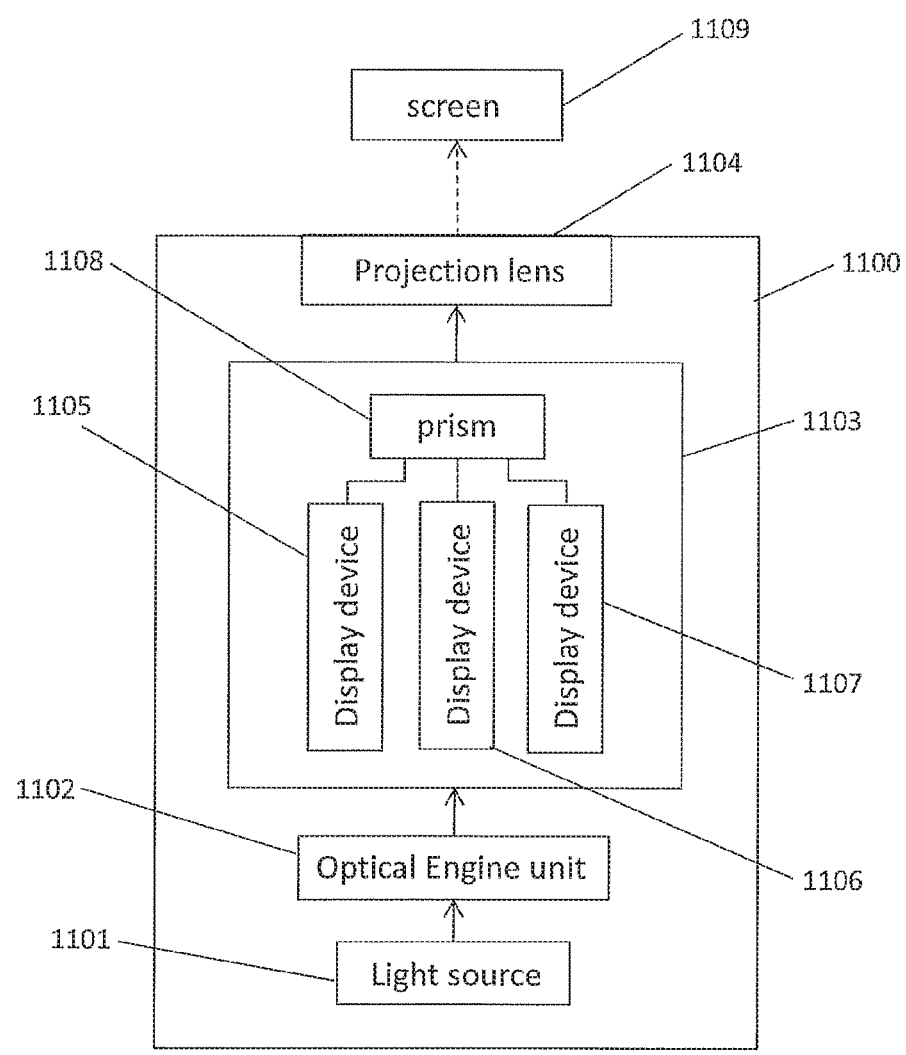
FIG. 11 is a block diagram showing a configuration of an exemplary embodiment of a projection display device including the light source device shown in any of the first to third exemplary embodiments.

FIG. 11 is a block diagram showing a configuration of an exemplary embodiment of a projection display device including the light source device described in any of the first to third exemplary embodiments.

Projection display device 1100 includes light source 1101, which is the light source device described in each of the exemplary embodiments described above, optical engine unit 1102, image forming unit 1103, and projection lens (projection optical system) 1104. Image forming unit 1103 includes display devices 1105 to 1107 for modulating light according to image signals, and has a function of forming an image based on light emitted from optical engine unit 1102. In the present exemplary embodiment, a digital micromirror device (DMD), which is a reflective display element, is used as each of display devices 1105 to 1107. Furthermore, in the present exemplary embodiment, image forming unit 1103 includes three display devices 1105 to 1107 corresponding to red light, green light, and blue light. Projection lens 1104 has a function of projecting light emitted from image forming unit 1103 on screen 1109 or the like, and of displaying the light as an image.

Projection display device 1100 also includes a cooling device for cooling the DMD of the image forming unit.

Additionally, in the first to third exemplary embodiments, the flow channel is described to be formed from a heat dissipating member formed on a support member, and a flow channel cover covering the heat dissipating member, but the flow channel may alternatively be formed only from the flow channel cover without the heat dissipating member being formed.

REFERENCE SIGNS LIST 101, 508, 808 semiconductor light-emitting element
102, 510, 810 holding member
103, 506, 806 substrate
104, 507, 807 connector
201, 501, 801 inlet port
202, 502, 802 branching chamber
203, 503, 803 flow channel
204, 504, 804 merging chamber
205, 505, 805 outlet port
206, 514, 814 wire
301, 509, 809 pressing member
401, 515, 815 insulating member
402, 513, 813 lead terminal
403, 512, 812 flow channel cover
404, 511, 811 heat dissipating member
406 through hole

The invention claimed is:

1. A light source device comprising:
a plurality of semiconductor light-emitting elements that are arranged in n rows and m columns; and
a plurality of flow channels where a cooling medium flows through, said plurality of flow channels being formed to sandwich said n rows of semiconductor light-emitting elements or said m columns of semiconductor light-emitting elements, wherein
said semiconductor light-emitting elements are mounted on a holding member,
the holding member includes a plurality of heat dissipating members that are formed on a surface opposite a surface where said semiconductor light-emitting elements are mounted, the heat dissipating members being formed along said n rows of semiconductor light-emitting elements or said m columns of semiconductor light-emitting elements, respectively, and
said flow channels are formed by a plurality of flow channel covers covering the plurality of heat dissipating members respectively.

2. The light source device according to claim 1, wherein the holding member includes recessed portions, and said semiconductor light-emitting elements are installed in the recessed portions.

3. The light source device according to claim 1, wherein the holding member includes a plurality of through holes each allowing a lead terminal of each semiconductor light-emitting element to pass through, and
the light source device includes a plurality of substrates that are connected to the lead terminals of said n rows of semiconductor light-emitting elements or said m columns of semiconductor light-emitting elements, and that are provided adjacent to said flow channels.

4. The light source device according to claim 3, wherein two lead terminals are provided at each semiconductor light-emitting element, and a line joining the two lead terminals are connected to said substrate in a manner coinciding with an array direction of said n rows of semiconductor light-emitting elements or said m columns of semiconductor light-emitting elements.

5. The light source device according to claim 3, wherein two lead terminals are provided at each semiconductor light-emitting element, and a line joining the two lead terminals are connected to said substrate while being orthogonal to an array direction of said n rows of semiconductor light-emitting elements or said m columns of semiconductor light-emitting elements.

6. The light source device according to claim 1, wherein the holding member includes a plurality of through holes each allowing a lead terminal of each semiconductor light-emitting element to pass through, and
the light source device includes
a plurality of conducting sockets that are provided adjacent to said flow channels, and
at least one substrate that is connected, through the plurality of conducting sockets, to the lead terminals of said n rows of semiconductor light-emitting elements or said m columns of semiconductor light-emitting elements.

7. A projection display device comprising a cooling structure for a semiconductor light-emitting element according to claim 1.

8. A method of cooling a semiconductor light-emitting elements, that are arranged in n rows and m columns,
the method comprising forming a plurality of flow channels, where a cooling medium flows through, in such a way as to sandwich the n rows of semiconductor light-emitting elements or the m columns of semiconductor light-emitting elements,
said semiconductor light-emitting elements are mounted on a holding member,
the holding member includes a plurality of heat dissipating members that are formed on a surface opposite a surface where said semiconductor light-emitting elements are mounted, the heat dissipating members being formed along said n rows of semiconductor light-emitting elements or said m columns of semiconductor light-emitting elements, respectively, and
said flow channels are formed by a plurality of flow channel covers covering the plurality of heat dissipating members, respectively.

\* \* \* \* \*